United States Patent
Lavoie et al.

(10) Patent No.: US 8,981,565 B2
(45) Date of Patent: Mar. 17, 2015

(54) TECHNIQUES TO FORM UNIFORM AND STABLE SILICIDE

(75) Inventors: Christian Lavoie, Ossining, NY (US); Dong-Ick Lee, Fishkill, NY (US); Ahmet Serkan Ozcan, Pleasantville, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 13/428,184

(22) Filed: Mar. 23, 2012

(65) Prior Publication Data
US 2013/0249099 A1    Sep. 26, 2013

(51) Int. Cl.
| | | |
|---|---|---|
| H01L 23/48 | (2006.01) | |
| H01L 23/52 | (2006.01) | |
| H01L 29/40 | (2006.01) | |
| H01L 21/285 | (2006.01) | |
| H01L 29/66 | (2006.01) | |

(52) U.S. Cl.
CPC ........ *H01L 21/28518* (2013.01); *H01L 29/665* (2013.01)
USPC ........... 257/769; 257/757; 257/383; 438/682; 438/664; 438/655

(58) Field of Classification Search
CPC ............ H01L 21/28518; H01L 29/665; H01L 23/53209; H01L 29/66507; H01L 21/82314; H01L 29/7848; H01L 21/28052; H01L 29/4933
USPC ........... 257/768, 757, 769, 382, 383, 384, 18, 257/19, 288, 754, 755; 438/682, 664, 660, 438/686, 651, 655
See application file for complete search history.

(56) References Cited

U.S. PATENT DOCUMENTS

| | | | |
|---|---|---|---|
| 2005/0073011 A1* | 4/2005 | Taguwa | 257/371 |
| 2005/0133834 A1* | 6/2005 | Sorada et al. | 257/288 |
| 2012/0326317 A1* | 12/2012 | Wu | 257/769 |

OTHER PUBLICATIONS

Imbert et al., "Nickel silicide encroachment formation and characterization," Microelectronics Engineering, vol. 87, Issue 3, pp. 245-248 Mar. 2010.
Yang et al., "Advanced in situ pre-Ni silicide (Siconi) cleaning at 65 nm to resolve defects in NiSix modules," Journal of Vacuum Science & Technology B, vol. 28, Issue 1 (2010).
T.G. Finstad, "Silicide formation with nickel and platinum double layers on silicon," Thin Solid Films, vol. 51, 3, pp. 411-424 Jun. 1978.
Besser et al., "Ge effects on silicidation," Microelectronic Engineering, vol. 82, Issues 3-4, pp. 467-473 Dec. 2005.

* cited by examiner

*Primary Examiner* — Thanh Y Tran
(74) *Attorney, Agent, or Firm* — Louis J. Percello; Michael J. Chang, LLC

(57) ABSTRACT

In one aspect, a method of fabricating a metal silicide includes the following steps. A semiconductor material selected from the group consisting of silicon and silicon germanium is provided. A metal(s) is deposited on the semiconductor material. A first anneal is performed at a temperature and for a duration sufficient to react the metal(s) with the semiconductor material to form an amorphous layer including an alloy formed from the metal(s) and the semiconductor material, wherein the temperature at which the first anneal is performed is below a temperature at which a crystalline phase of the alloy is formed. An etch is used to selectively remove unreacted portions of the metal(s). A second anneal is performed at a temperature and for a duration sufficient to crystallize the alloy thus forming the metal silicide. A device contact and a method of fabricating a FET device are also provided.

7 Claims, 5 Drawing Sheets

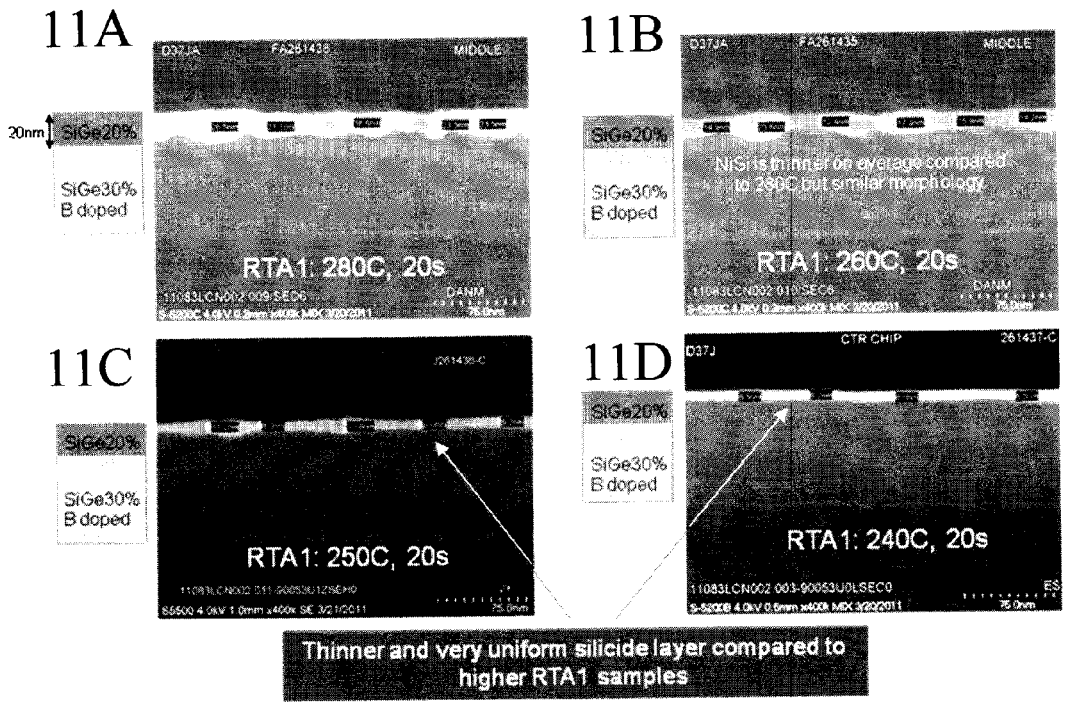
FIGS. 11A-D
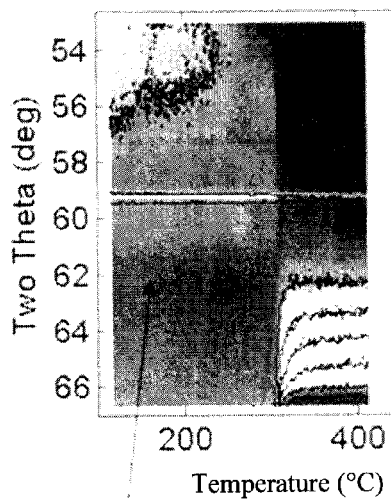
FIG. 12
At 240C, no crystalline phase nucleates yet.

TECHNIQUES TO FORM UNIFORM AND STABLE SILICIDE

FIELD OF THE INVENTION

The present invention relates to silicide formation and more particularly, to improved metal silicide fabrication techniques for use, for example, in forming field-effect transistor (FET) device contacts.

BACKGROUND OF THE INVENTION

Metal silicide formation is a process widely used in many metal-oxide semiconductor (MOS) device fabrication process flows. By way of example only, metal silicide is commonly used to form device contacts. Advantageously, metal silicide contacts can be formed using a maskless process thus simplifying production and reducing costs. Namely, a metal (such as nickel (Ni)) is deposited onto the device, and the metal silicide contact will form only in those areas where the metal is in contact with the silicon. Accordingly, contacts produced in this manner are termed "self-aligned" contacts.

However, conventional nickel (Ni) silicide formation below about 16 nanometers (nm) thickness (about 8 nm as deposited Ni) has shown yield degradation in every generation from 65 nm to 32 nm, due to thermal stability issues and pipe defect formation. See, for example, Imbert et al., "Nickel silicide encroachment formation and characterization," Microelectronics Engineering, Volume 87, Issue 3, pgs. 245-248 (March 2010) and Yang et al., "Advanced in situ pre-Ni silicide (Siconi) cleaning at 65 nm to resolve defects in $NiSi_x$ modules," Journal of Vacuum Science & Technology B, Volume 28, Issue 1 (2010), the contents of both of which are incorporated by reference herein.

Therefore, a solution is needed to extend Ni silicide to next CMOS generations which requires thinner and uniform (sub 15 nm) silicide contacts.

SUMMARY OF THE INVENTION

The present invention provides techniques for silicide fabrication. In one aspect of the invention, a method of fabricating a metal silicide is provided. The method includes the following steps. A semiconductor material selected from the group consisting of silicon and silicon germanium is provided. At least one metal is deposited on the semiconductor material. A first anneal is performed at a temperature and for a duration sufficient to react the at least one metal with the semiconductor material to form an amorphous layer having an alloy formed from the at least one metal and the semiconductor material, wherein the temperature at which the first anneal is performed is below a temperature at which a crystalline phase of the alloy is formed. An etch is used to selectively remove unreacted portions of the at least one metal. A second anneal is performed at a temperature and for a duration sufficient to crystallize the alloy thus forming the metal silicide.

In another aspect of the invention, a device contact is provided. The device contact includes a metal silicide formed on a semiconductor substrate, the metal silicide having an average grain size that is greater than about 3 times an average thickness of the metal silicide.

In another aspect of the invention, a method of fabricating a field-effect transistor (FET) device is provided. The method includes the following steps. A semiconductor material selected from the group consisting of silicon and silicon germanium is provided. A gate is formed over the semiconductor material. Spacers are formed on opposite sides of the gate. A metal layer is formed on a surface of the semiconductor material. A first anneal is performed at a temperature and for a duration sufficient to react the metal layer with the semiconductor material to form an amorphous layer having an alloy formed from the metal layer and the semiconductor material, wherein the temperature at which the first anneal is performed is below a temperature at which a crystalline phase of the alloy is formed. An etch is used to selectively remove unreacted portions of the metal layer. A second anneal is performed at a temperature and for a duration sufficient to crystallize the alloy to form a metal silicide.

A more complete understanding of the present invention, as well as further features and advantages of the present invention, will be obtained by reference to the following detailed description and drawings.

BRIEF DESCRIPTION OF THE DRAWINGS

FIGS. 11A-D are images illustrating that thinner, more uniform metal silicide formation is achieved using the present techniques according to an embodiment of the present invention;

FIG. 12 is a diagram illustrating how at low annealing temperatures (240° C.) with a nickel platinum and silicon sample no crystalline phase is formed according to an embodiment of the present invention.

DETAILED DESCRIPTION OF PREFERRED EMBODIMENTS

As described above, a solution is needed to extend Ni silicide to next complementary metal-oxide semiconductor (CMOS) generations which require thin and uniform (sub 15 nanometer (nm)) silicide contacts. However, with conventional techniques, the Ni silicide reaction usually ends up forming a very rough interface between the silicide and the silicon interface. The thinner the silicide, the more problematic the rough interface will be for device applications.

Advantageously, provided herein are improved techniques for forming a metal silicide that, as will be described in detail below, has the beneficial properties of 1) uniform thickness, 2) uniform alloy distribution (e.g., Pt), 3) in the case of a germanium (Ge)-containing silicide, Ge expulsion to bottom and top interfaces, and 4) more thermally stable as compared to conventionally formed nickel silicide of the same thickness. The term "metal silicide," as used herein refers to a compound containing silicon and at least one metal. According to the present teachings, silicon is however not the only semiconductor element the metal silicide might contain. By way of example only, the metal silicide might contain Ge. Such compounds are sometimes referred to in the art as germanosilicides. Whether the compound contains silicon alone or in combination with one or more other semiconductor elements, it will be referred to herein as a silicide. Thus for example, for ease and clarity of description, a metal germanosilicide will be referred to herein simply as a metal silicide. The present techniques will now be described by way of reference to FIGS. 1-4.

The process begins with a semiconductor substrate 102. See FIG. 1. The term "substrate" as used herein refers generally to any structure on which silicide formation is desired. In a simple example, the substrate 102 is a bulk silicon (Si) or silicon germanium (SiGe) wafer or a semiconductor-on-insulator (SOI) (e.g., Si or SiGe) layer in a SOI wafer. As is known in the art, an SOI wafer includes a SOI layer over a buried oxide or BOX. However, substrate 102 can be representative of any device structure on which a silicide contact is to be formed. By way of example only, substrate 102 can represent a Si or SiGe source and drain region of a field effect transistor (FET) device.

Figure 1:
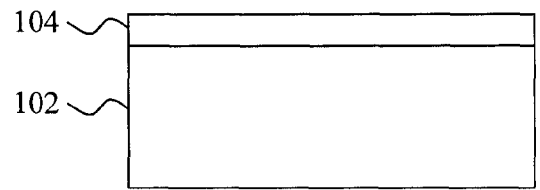
FIG. 1 is a cross-sectional diagram illustrating a metal(s) (e.g., nickel platinum alloy (NiPt)) having been deposited onto a (e.g., silicon (Si) or silicon germanium (SiGe)) substrate according to an embodiment of the present invention.

Next, as shown in FIG. 1, a metal layer 104 is deposited onto the substrate 102. According to an exemplary embodiment, metal layer 104 includes nickel (Ni), platinum (Pt) and combinations including at least one of the foregoing metals. For instance, metal layer 104 can include a nickel-platinum (NiPt) alloy. Metal layer 104 may be formed by depositing the subject metal(s) onto the substrate 102 using an evaporation process, such as molecular beam epitaxy (MBE), to a thickness of from about 2 nanometers (nm) to about 15 nm, e.g., from about 5 nm to about 10 nm.

When the metal layer 104 includes a NiPt alloy (or other NiX alloy), as will be described in detail below, during a second (high temperature) anneal to crystallize the silicide the nickel will be consumed by the silicide process growth forming nickel silicide (NiSi), while the platinum (or other metal(s) in the alloy) will diffuse through the silicide layer to the silicide interface(s). See, for example, T. G. Finstad, "Silicide formation with nickel and platinum double layers on silicon," Thin Solid Films, vol. 51, 3, pgs. 411-424 (June 1978) (hereinafter "Finstad"), the contents of which are incorporated by reference herein. It may thus be desirable to employ an optional etch after the second anneal to remove the platinum (or other metal(s) in the alloy).

A first anneal is then performed to react the metal layer 104 with the semiconductor material (e.g., Si or SiGe) in the substrate 102 so as to form a metal semiconductor alloy. See FIG. 2. The anneal in this step is performed at a temperature and for a duration sufficient to form an amorphous layer 202 containing the metal semiconductor alloy, but the anneal temperature employed is not high enough to cause a crystalline phase of the alloy to form. According to an exemplary embodiment, this first anneal is performed at a temperature of from about 200 degrees Celsius (° C.) to about 250° C., for example, from about 210° C. to about 225° C., for a duration of from about 1 second to about 120 seconds, for example, less than or equal to about 30 seconds, e.g., about 30 seconds. By way of example only, this first anneal may be performed using rapid thermal annealing (RTA), furnace anneal, a flash (lamp)-based tool (such as a lamp-based RTA system) or a microwave anneal tool. Of course, the particular annealing process/system employed will dictate the temperature and duration parameters but it is preferable that the above-provided temperature and duration values are used in order to prevent formation of the crystalline phase. For instance, a higher temperature might warrant a shorter duration and conversely a lower temperature might warrant a longer duration.

As will be described in detail below, in the case where the metal silicide contains Ge, advantageously, use of the present techniques results in Ge expulsion to the bottom and top interfaces. Without being limited to any particular theory, it is thought that a majority of this Ge expulsion occurs during a second (high temperature) anneal (described below) which also serves to crystallize the first formed phase. Again without being limited to any particular theory it is thought that possibly Ge is not soluble in the crystal phase that forms and it is expelled like an impurity.

By comparison, with conventional silicide processes an anneal is typically performed at this stage at temperatures exceeding 260° C., such as from about 260° C. to about 320° C. As a result, with conventional processes portions of crystalline phase alloy are formed. As described above, the crystalline phase formation at this stage of the process undesirably leads to a very rough silicide-silicon interface which becomes problematic for device applications especially in cases where thinner silicide layers (e.g., less than about 16 nm) are employed. As a result, the silicide produced using conventional techniques ends up having a non-uniform thickness profile which introduces unacceptable levels of device variation.

Figure 2:
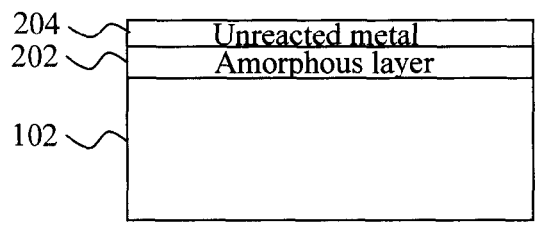
FIG. 2 is a cross-sectional diagram illustrating an amorphous layer formed by a first (low temperature) anneal that contains an alloy formed from the at least one metal and the semiconductor material by the first anneal and a layer of unreacted metal on top of the amorphous layer present after the first anneal according to an embodiment of the present invention.
Figure 3:
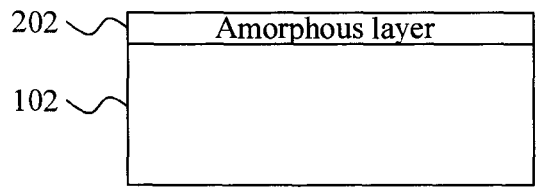
FIG. 3 is a cross-sectional diagram illustrating the unreacted metal having been selectively removed according to an embodiment of the present invention.
Figure 4:
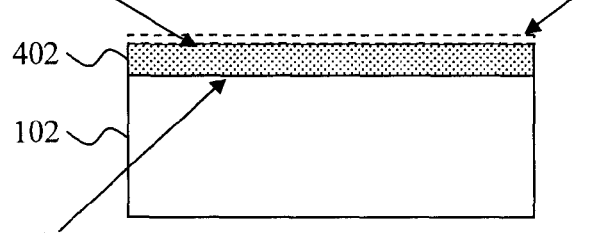
FIG. 4 is a cross-sectional diagram illustrating the formation of a metal silicide layer by crystallization of the amorphous layer using a second, higher temperature anneal according to an embodiment of the present invention.

Returning to the present process, as shown in FIG. 2, following the first anneal, there is an unreacted portion 204 of the at least one metal 104 present on top of the amorphous layer 202. This unreacted portion 204 of the at least one metal 104 is removed in the next step.

Namely, the unreacted portion 204 of the at least one metal 104 can be selectively removed (vis-à-vis the amorphous layer 202) using a wet etching process. See FIG. 3. Suitable wet etching processes include, but are not limited to, hydrochloric acid (HCL), hydrofluoric acid, nitric acid ($HNO_3$), dilute Aqua Regia ($HNO_3+HCl+H_2O$), piranha (sulfuric acid ($H_2SO_4$) and hydrogen peroxide ($H_2O_2$)) or standard RCA clean.

A second anneal is then performed to crystallize the alloy (i.e., crystallize the amorphous layer 202), forming metal silicide layer 402. See FIG. 4. The second anneal is performed at a temperature and for a duration sufficient to crystallize the amorphous layer 202 and thus is preferably at a higher temperature than the first anneal (see above). According to an exemplary embodiment, this second anneal is performed at a temperature of from about 400° C. to about 1,000° C., for example, from about 450° C. to about 600° C., for a duration of from about 1 second to about 60 seconds. By way of example only, this second anneal may be performed using RTA, furnace anneal, laser anneal or a lamp-based tool (such as a lamp-based RTA system). Of course, the particular annealing process/system employed will dictate the temperature and duration parameters but it is preferable that the above-provided temperature and duration values are used in order to form the crystalline phase. For instance, a higher temperature might warrant a shorter duration and conversely a lower temperature might warrant a longer duration.

According to an exemplary embodiment, the metal silicide layer 402 is formed having a thickness of less than about 16 nm, e.g., from about 5 nm to about 15 nm. At such scaled thicknesses the above-mentioned composition and thickness variations associated with conventional processes would be apparent and would have significant effects on device performance.

When the silicide-forming metal employed includes a NiPt alloy (or other NiX alloy), during this second anneal the nickel will be consumed by the silicide process growth forming nickel silicide (NiSi), while the platinum (or other metal(s) in the alloy) will diffuse through the silicide layer to the silicide interface(s). See, for example, Finstad. Optionally, this unreacted platinum (or other metal(s) in the alloy) may be removed. See FIG. 4. According to an exemplary embodiment, the unreacted platinum (or other metal(s) in the alloy) may be removed using a wet etching process. Suitable wet etching processes include, but are not limited to, HCL, hydrofluoric acid, nitric acid ($HNO_3$), dilute Aqua Regia ($HNO_3+HCl+H_2O$), piranha ($H_2SO_4$ and $H_2O_2$) or standard RCA clean.

As provided above, one advantage of the present techniques is that when the silicide-forming semiconductor contains Ge (for example, when the starting substrate is a SiGe substrate see, e.g., description of FIG. 1, above), the Ge is expelled by way of the present process out of the bulk of the silicide (see for example FIG. 13, described below) to the silicide interfaces. Thus, there is Ge depletion in the bulk of the silicide. This result is advantageous since the presence of Ge in the silicide can result in thermal stability issues. See, for example, Besser et al., "Ge effects on silicidation," Microelectronic Engineering, Volume 82, Issues 3-4, pgs. 467-473 (December 2005) (hereinafter "Besser"), the contents of which are incorporated by reference herein. For instance, the presence of Ge lowers the melting point of the resulting silicide. As a result, the silicide is often not suitable for use as a doped contact since the temperatures employed to dope the contact would (with the lowered melting point) cause atom diffusion, which is undesirable. As described above, without being limited to any particular theory, it is thought that a majority of this Ge expulsion occurs during this second (high temperature) anneal.

The silicide interfaces referred to above, and elsewhere herein, are by way of example the interface between the silicide and the underlying substrate and/or the surface of the silicide. See FIG. 4. Further, when it is described herein that there is Ge depletion in the bulk of the silicide, it is to be understood that there might be some level of Ge in the bulk of the silicide but the level of Ge is less than with conventional processes. To provide some parameters for this concept, by way of example only, the term "bulk of the silicide" as used herein in the context of Ge composition refers to the entire metal silicide layer 402 or a portion of silicide layer 402 excluding the above-mentioned interface(s). Thus, for instance, where the interfaces (to which the Ge is expelled) are i) the interface between the metal silicide layer 402 and the semiconductor substrate 102 and ii) the surface of the metal silicide layer 402, and assuming that these interfaces each occupy about 1% of the (top and bottom) average thickness of the metal silicide layer 402, then the central portion of the thickness of the metal silicide layer 402 (i.e., about 1% of the average thickness of the layer up from the metal silicide/substrate interface and about 1% of the average thickness of the layer down from the surface of the metal silicide layer) is considered the bulk of the silicide. For instance, using the example where the metal silicide layer 402 is formed having a thickness of from about 5 nm to about 15 nm, then the top interface (the surface of metal silicide layer 402) would make up from about 0.05 nm to about 0.15 nm of the silicide layer, as would the bottom interface (the metal silicide layer 402/semiconductor substrate 102 interface), with the remaining central portion of the metal silicide layer 402 being the bulk of the silicide.

The Ge content in the silicide is dependent on the Ge content (if any) in the starting substrate. For example, if the starting substrate contains about 20% Ge and about 80% Si, then with conventional silicide processes the silicide would (uniformly) include throughout about 10% Ge and about 40% Si. By contrast, with the present techniques, using the same starting substrate composition, the bulk of the silicide will contain only from about 2% to about 5% Ge (and from about 45% to about 48% Si).

Thus, according to the present techniques, the Ge content is greater at the interface of the metal silicide layer and the substrate and/or at the surface of the metal silicide layer than in the bulk of the silicide. Further, analysis of samples prepared using the present techniques have indicated that the Ge concentration at the interfaces is greater than the Ge concentration in the starting substrate. The analysis was performed using atom probe tomography. By comparison, advantageously, the metal silicide layer 402 formed by the present techniques has a uniform thickness, a uniform alloy distribution, larger grain size, an 'epitaxial' texture and better thermal stability. Each of these unique properties of the present materials will now be described.

Uniformity of thickness is quantified herein using a root mean square (RMS) average which is a common statistical tool used to measure the magnitude of a varying quantity. Use of the present techniques produces metal silicide layers that have an RMS less than about 20% that of the average metal silicide layer thickness, e.g., an RMS of from about 5% to about 15% that of the average metal silicide layer thickness. See also the example provided in FIGS. 11A-D. The average metal silicide layer thickness as used here and elsewhere throughout the description refers to the notion that the thickness of the metal silicide layer will vary (will be different) for different parts of the layer. However, if one were to take a statistical sampling of thickness measurements and obtain an average value, that would constitute an average thickness of the metal silicide layer. This concept and the steps involved in obtaining this value would be apparent to one of skill in the art and thus are not described further herein.

In the case where the silicide-forming metal is a nickel alloy (e.g., a NiPt alloy), advantageously, use of the present techniques results in a uniform alloy distribution. Uniformity of alloy distribution is quantified herein as follows: if the alloy employed is NiPt, then the average Pt atomic % variation between a top half of the metal silicide layer 402 and a bottom half of the metal silicide layer 402 is less than about 50% (e.g., from about 15% to about 40%) of the total Pt atomic % in the metal silicide layer 402. The top half/bottom half of the metal silicide layer 402 is defined simply as follows: if the metal silicide layer 402 has a thickness T nm, then moving from the bottom of the layer to the top, the first T/2 nm represents the bottom half and the next T/2 nm represents the top half. So, using an example, if the metal silicide layer 402 has a total thickness of 10 nm, then the bottom 5 nm is the bottom half of the metal silicide layer 402 and the top 5 nm is the top half of the metal silicide layer 402. The example given above uses Pt as the metal in combination with Ni to form the alloy, but in practice any other metal(s) in combination with Ni may be used to form the alloy employed, i.e., NiX.

Grain size (of the silicide) is quantified herein based on the average thickness of the metal silicide layer. Advantageously, use of the present techniques can result in the metal silicide layer 402 having an average grain size (wherein grain size is quantified as a largest cross-sectional dimension of a grain) that is greater than about 3 times (3×) (e.g., from about 3× to about 4×) larger than the average thickness of the metal silicide layer 402. Thus, for instance, if the metal silicide layer 402 has a thickness of 15 nm than the average grain size is greater than 45 nm.

An epitaxial texture refers to an orientation of the grains of the metal silicide layer 402. Using the present techniques, the metal silicide layer 402 formed has a grain orientation patterned off of the underlying substrate 102. This is beneficial in terms of lower contact/interface resistance.

Thermal stability is defined as a temperature at which morphological degradation of the metal silicide layer 402 occurs. Advantageously, the metal silicide layer 402 produced using the present techniques exhibits a greater thermal stability as compared to silicides produced using conventional techniques. For example, morphological degradation of the present metal silicide materials does not occur until temperatures above 10° C. are reached.

As highlighted above, the present techniques may be generally applied in any fabrication process where a metal silicide formation is desired. To further illustrate the present techniques in the context of a device fabrication process flow, the following non-limiting example is now provided and described in conjunction with the description of FIGS. 5-10.

Namely, FIGS. 5-10 illustrate an exemplary process flow for fabricating a field-effect transistor (FET) device wherein source and drain contacts will be formed using the present techniques. In this example, the starting platform for the device fabrication process is a SOI or a bulk semiconductor wafer. SOI and bulk wafers were described above. In the context of the present invention, the SOI layer or bulk wafer contains Si or SiGe and is represented generically in FIGS. 5-10 as semiconductor layer 502.

Figure 5:
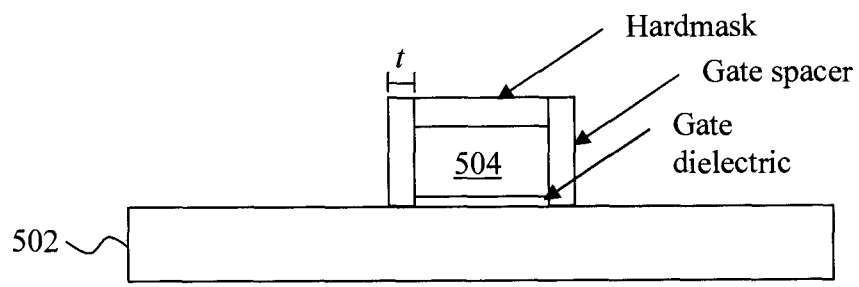
FIG. 5 is a cross-sectional diagram illustrating a field effect transistor (FET) device with a gate over a semiconductor material and spacers on opposite sides of the gate according to an embodiment of the present invention.
Figure 6:
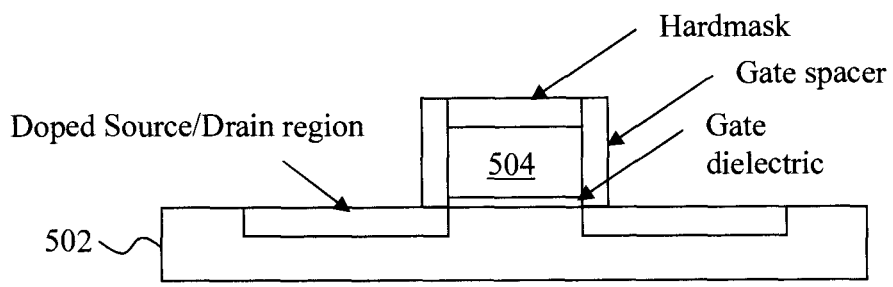
FIG. 6 is a cross-sectional diagram illustrating source and drain regions of the device having been formed by implanting a dopant(s) into the semiconductor layer adjacent to/on opposite side of the gate according to an embodiment of the present invention.
Figure 7:
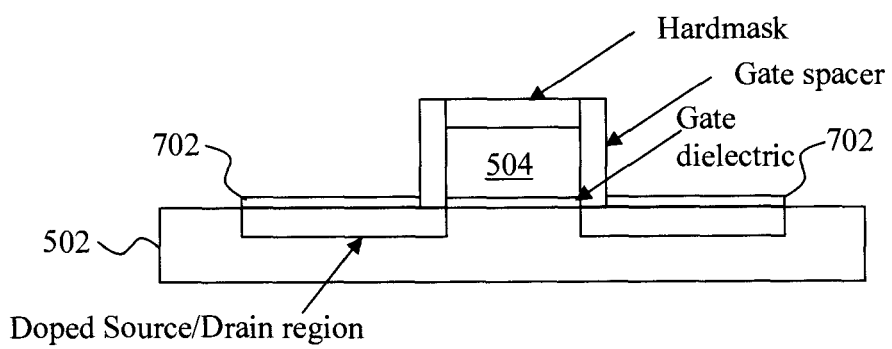
FIG. 7 is a cross-sectional diagram illustrating a metal layer having been deposited onto the semiconductor layer in the source and drain regions according to an embodiment of the present invention.

A FET device is formed on the semiconductor layer 502. See FIG. 5. As shown in FIG. 5, the FET device includes a gate 504 over the semiconductor layer 502. In general a FET includes a source region and a drain region interconnected by a channel and a gate that regulates electron flow through the channel. In this example, the source and drain regions and the channel will be formed in the semiconductor layer 502. The channel is the portion of the semiconductor layer 502 that is under the gate 504.

As shown in FIG. 5, the gate 504 may be separated from the semiconductor layer 502 by an optional gate dielectric. According to an exemplary embodiment, the gate 504 is a metal gate (which is made up of a single or multiple metal layers as is known in the art) and the gate dielectric is a single layer of a gate dielectric material such as (but not limited to) hafnium oxide, or alternatively the gate dielectric is made up of multiple layers of different dielectric materials.

To form the gate, the gate material is deposited and then standard lithography techniques are used to pattern the gate 504. For example, as shown in FIG. 5, a hardmask is used to pattern the gate line. As highlighted above, the gate material can be a metal or metals. Suitable gate metals include, but are not limited to titanium nitride (TiN), tantalum nitride (TaN), tungsten (W), gold (Au), titanium (Ti), aluminum (Al), platinum (Pt) and combinations including at least one of the foregoing metals.

As shown in FIG. 5, gate spacers are present on opposite sides of the gate 504. According to an exemplary embodiment, the spacers can be formed from a nitride material, such as (but not limited to) silicon nitride. Standard techniques are employed to form the spacers. For example, the spacer material can be blanket deposited over the structure and then patterned to form the spacers. According to an exemplary embodiment, the spacers are formed having a thickness t of from about 5 nm to about 30 nm.

Source and drain regions of the device are then formed by implanting a dopant(s) into the semiconductor layer 502 adjacent to/on opposite side of the gate 504. See FIG. 6. By way of example only, suitable source/drain dopants include, but are not limited to, silicon (n-type) and carbon (p-type), wherein the particular dopant employed will depend on the device being formed (e.g., an n-channel FET or a p-channel FET, respectively). The implanted dopants can be activated using an anneal, for example, at a temperature of from about 400° C. to about 1,000° C.

Source and drain contacts are then formed using the techniques described in conjunction with the description of FIGS. 1-4, above. Namely, to begin this contact-formation process, a metal layer 702 is deposited onto the semiconductor layer 502 in the source and drain regions. See FIG. 7. As described in detail above, the metal layer 702 preferably includes Ni, Pt or combinations including at least one of the foregoing metals, such as a NiPt alloy. According to an exemplary embodiment, the metal layer 702 is formed by depositing the subject metal(s) onto the semiconductor layer 502 in the source and drain regions using an evaporation process, such as MBE, to a thickness of from about 2 nm to about 15 nm, e.g., from about 5 nm to about 10 nm.

Next, as described above, a first anneal is performed to react the metal layer 702 with the semiconductor material (e.g., Si or SiGe) in the semiconductor layer 502 so as to form a metal semiconductor alloy. See FIG. 8. The anneal in this step is performed at a temperature and for a duration sufficient to form an amorphous layer 802 containing the metal semiconductor alloy, but the anneal temperature employed is not high enough to cause a crystalline phase of the alloy to form. According to an exemplary embodiment, this first anneal is performed at a temperature of from about 200° C. to about 250° C., for example, from about 210° C. to about 225° C., for a duration of from about 1 second to about 120 seconds, for example, less than or equal to about 30 seconds, e.g., about 30 seconds.

Figure 8:
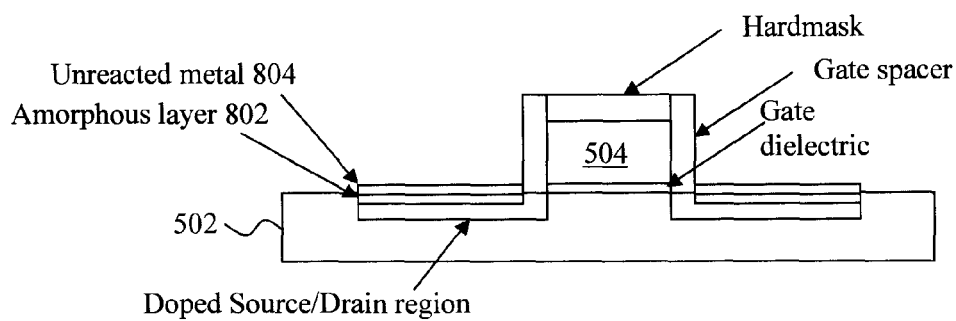
FIG. 8 is a cross-sectional diagram illustrating an amorphous layer formed by a first (low temperature) anneal that contains an alloy formed from the metal layer and the semiconductor layer by the first anneal and a layer of unreacted metal on top of the amorphous layer present after the first anneal according to an embodiment of the present invention.
Figure 9:
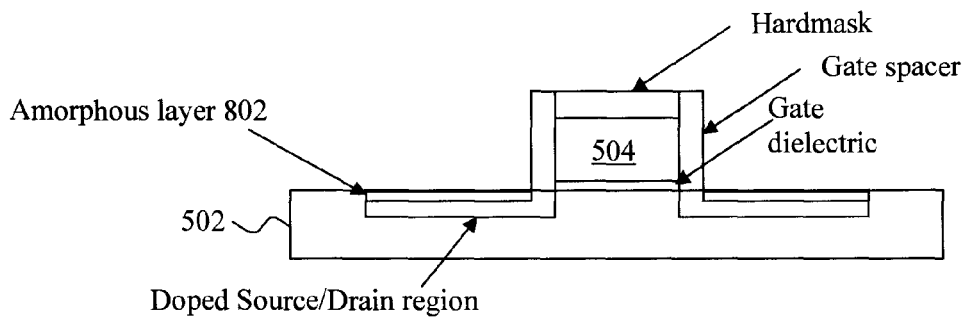
FIG. 9 is a cross-sectional diagram illustrating the unreacted metal having been selectively removed according to an embodiment of the present invention.
Figure 10:
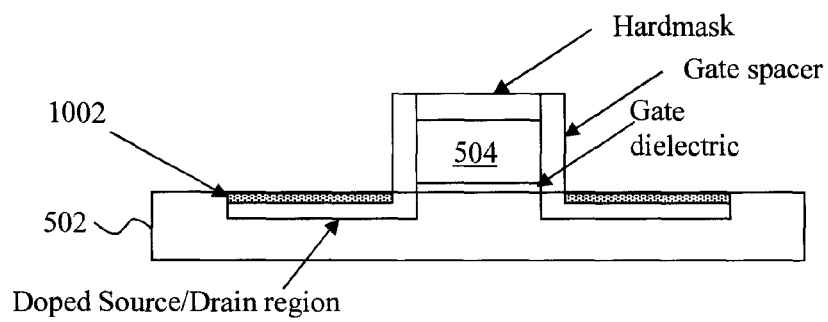
FIG. 10 is a cross-sectional diagram illustrating the formation of a metal silicide layer by crystallization of the amorphous layer using a second, higher temperature anneal according to an embodiment of the present invention.

As shown in FIG. 8, following the first anneal, there is an unreacted portion 804 of the metal layer 702 present on top of the amorphous layer 802. This unreacted portion 804 of the metal layer 702 is removed in the next step.

Namely, the unreacted portion 804 of the metal layer 702 can be selectively removed (vis-à-vis the amorphous layer 802) using a wet etching process. See FIG. 9. Suitable wet etching processes include, but are not limited to, HCL, hydrofluoric acid, nitric acid (HNO$_3$), dilute Aqua Regia (HNO$_3$+HCl+H$_2$O), piranha (H$_2$SO$_4$ and H$_2$O$_2$) or standard RCA clean.

A second anneal is then performed to crystallize the alloy (i.e., crystallize the amorphous layer 802), forming metal silicide layer 1002. See FIG. 10. The second anneal is performed at a temperature and for a duration sufficient to crystallize the amorphous layer 802 and thus is preferably at a higher temperature than the first anneal. According to an exemplary embodiment, this second anneal is performed at a temperature of from about 400° C. to about 1,000° C., for example, from about 450° C. to about 600° C., for a duration of from about 1 second to about 60 seconds.

According to an exemplary embodiment, the metal silicide layer 1002 is formed having a thickness of less than about 16 nm, e.g., from about 5 nm to about 15 nm. At such scaled thicknesses the above-mentioned composition and thickness variations associated with conventional processes would be apparent and would have significant effects on device performance. As described above, when the silicide-forming metal employed includes a NiPt alloy (or other NiX alloy), during this second anneal the nickel will be consumed by the silicide process growth forming nickel silicide (NiSi), while the platinum (or other metal(s) in the alloy) will diffuse through the silicide layer to the silicide interface(s). See, for example, Finstad. Optionally, this unreacted platinum (or other metal(s) in the alloy) may be removed, e.g., using a wet etching process. Suitable wet etching processes include, but are not limited to, HCL, hydrofluoric acid, nitric acid (HNO$_3$), dilute Aqua Regia (HNO$_3$+HCl+H$_2$O), piranha (H$_2$SO$_4$ and H$_2$O$_2$) or standard RCA clean.

As provided above, the present techniques result in thinner and more uniform silicide layers. This advantage is further illustrated by way of reference to the examples shown in FIGS. 11A-D. Each of the samples shown in FIGS. 11A-D was prepared by depositing a 10 nm thick NiPt layer on a silicon substrate, annealing (first anneal), removing unreacted metal by etching, annealing (second anneal) at 420° C. for 30 seconds (s) followed by an optional second etch (i.e., to remove unreacted Pt, see above and FIG. 4). The only variable between the four samples shown in FIGS. 11A-D is the temperature of the first anneal. Temperatures of 280° C., 260° C., 250° C. and 240° C. were employed in the samples shown in FIGS. 11A-D, respectively, all for a duration of 20 seconds. As shown in FIGS. 11A-D, the samples wherein the first anneal was performed at a temperature of lower than 260° C. (see FIGS. 11C and 11D) have significantly thinner and more uniform metal silicide layers produced (as compared to those shown in FIGS. 11A and 11B).

FIG. 12 is a diagram illustrating how at low annealing temperatures, such as those described above with regard to the first anneal (see for example, the description of FIG. 2, above) used to form the amorphous layer containing the alloy formed from the at least one metal and the semiconductor material, no crystalline phase is formed. Specifically, FIG. 12 illustrates how with a sample containing 10 nm NiPt as the metal deposited on Si substrate and an RTA at 240° C. no crystalline phase forms.

Figure 13:
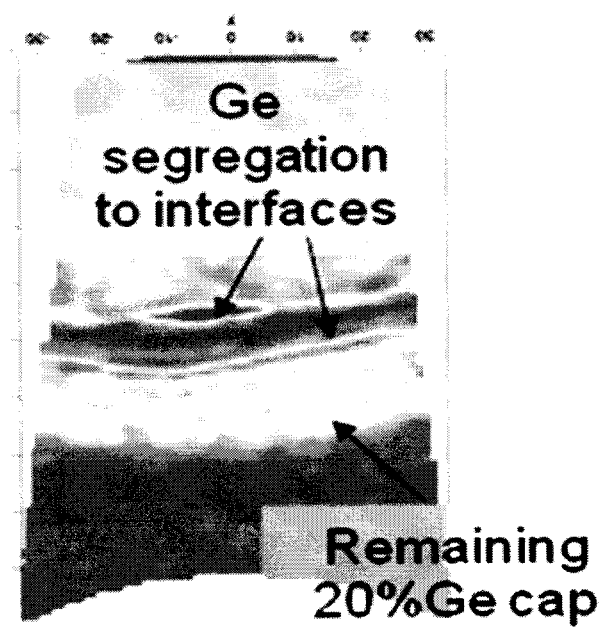
FIG. 13 is a diagram illustrating that the present process results in Ge depletion in the resulting metal silicide according to an embodiment of the present invention.

As described above, the presence of Ge in the silicide can result in thermal stability issues. See, for example, Besser. For instance, the presence of Ge lowers the melting point of the resulting silicide. As a result, the silicide is often times not suitable for use as a doped contact since the temperatures employed to dope the contact would (with the lowered melting point) cause atom diffusion, which is undesirable. Advantageously, it has been found that through the use of the present techniques (see, for example, the description of FIG. 4 above), the Ge migrates to an interface between the silicide and the semiconductor substrate and/or to the surface of the silicide. Thus, there is Ge depletion in the bulk of the silicide. See FIG. 13. Namely, FIG. 13 illustrates that in a metal silicide fabricated according to the present techniques, the Ge migrates to the silicide interfaces (see description of FIG. 4, above). As described above, while some (reduced) amount of the Ge might remain in the metal silicide layer, there is an overall depletion of Ge in the bulk silicide.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A device contact, comprising:
a metal silicide containing nickel and platinum formed on a semiconductor substrate, wherein the metal silicide is a continuous layer on the semiconductor substrate having an average grain size that is greater than about 3 times an average thickness of the metal silicide, wherein a uniform alloy distribution is present in the metal silicide such that an average atomic percent variation of the platinum between a top half of the metal silicide and a bottom half of the metal silicide is less than about 50% of a total atomic percent of the platinum in the metal silicide, and wherein the metal silicide has an epitaxial texture in that a grain orientation of the metal silicide is patterned off of the semiconductor substrate.

2. The device contact of claim 1, wherein the metal silicide contains silicon and germanium and wherein i) a concentration of the Ge in the metal silicide at an interface between the metal silicide and the semiconductor substrate and ii) a concentration of the Ge in the metal silicide at a surface interface of the metal silicide are greater than a concentration of the Ge in a bulk of the metal silicide, wherein the interface between the metal silicide and the semiconductor substrate has a thickness that is about 1% of an average thickness of the metal silicide, wherein the surface interface of the metal silicide has a thickness that is about 1% of the average thickness of the metal silicide, and wherein a remainder of the average thickness of the metal silicide comprises the bulk of the metal silicide.

3. The device contact of claim 2, wherein the bulk of the metal silicide contains from about 2% to about 5% germanium, and from about 45% to about 48% silicon.

4. The device contact of claim 1, wherein the average atomic percent variation of the platinum between the top half of the metal silicide and the bottom half of the metal silicide is from about 15% to about 40% of the total atomic percent of the platinum in the metal silicide.

5. The device contact of claim 1, wherein the metal silicide has a thickness of from about 5 nanometers to about 15 nanometers.

6. The device contact of claim 1, wherein the metal silicide has a uniform thickness such that the metal silicide has a root mean square of less than about 20% that of the average thickness of the metal silicide.

7. The device contact of claim 1, wherein the metal silicide has a uniform thickness such the metal silicide has a root mean square of from about 5% to about 15% that of the average thickness of the metal silicide.

* * * * *